United States Patent
Tahara

(10) Patent No.: US 7,567,489 B2
(45) Date of Patent: Jul. 28, 2009

(54) LIGHT DETECTOR, OPTICAL PICKUP, AND OPTICAL DISC APPARATUS

(75) Inventor: Katsutoshi Tahara, Tokyo (JP)

(73) Assignee: Sony Corporation, Tokyo (JP)

( * ) Notice: Subject to any disclaimer, the term of this patent is extended or adjusted under 35 U.S.C. 154(b) by 770 days.

(21) Appl. No.: 11/319,468

(22) Filed: Dec. 29, 2005

(65) Prior Publication Data

US 2006/0171017 A1  Aug. 3, 2006

(30) Foreign Application Priority Data

Jan. 28, 2005 (JP) ............... 2005-020691

(51) Int. Cl.
G11B 11/00 (2006.01)
G11B 7/00 (2006.01)
G11B 5/09 (2006.01)

(52) U.S. Cl. ............... 369/53.27; 369/120; 369/124.09; 369/124.12; 369/53.26; 369/116; 369/47.5

(58) Field of Classification Search ............ 369/124.12, 369/53.27, 53.35, 53.26, 116, 47.5–47.53, 369/47.25, 44.29, 120, 124.09, 13.26, 44.1; 359/333, 337.12, 337.13

See application file for complete search history.

(56) References Cited

U.S. PATENT DOCUMENTS

2003/0031100 A1*  2/2003  Kadlec et al. ............ 369/44.29
2005/0111340 A1*  5/2005  Nagara et al. ........... 369/124.05
2005/0265205 A1*  12/2005  Chuang et al. ............ 369/116

FOREIGN PATENT DOCUMENTS

| JP | 1-243250 | 9/1989 |
| JP | 4-103044 | 4/1992 |
| JP | 9-121068 | 5/1997 |
| JP | 2003-228870 | 8/2003 |
| JP | 2003-257074 | 9/2003 |
| JP | 2004-152375 | 5/2004 |

* cited by examiner

Primary Examiner—Wayne R Young
Assistant Examiner—Dionne H Pendleton
(74) Attorney, Agent, or Firm—Oblon, Spivak, McClelland, Maier & Neustadt, P.C.

(57) ABSTRACT

A light detector includes a light-receiving device that receives a light beam applied from a light source irradiating an optical recording medium with the light beam and that generates detection signals, and a power monitor circuit section that generates a power monitor signal for monitoring output power of the light source in accordance with the detection signals. The device includes split light-receiving elements. The detection signals are output from the split light-receiving elements as split detection signals. The section includes an amplifying circuit generating the power monitor signal and outputting the power monitor signal as differential signals, a fixed resistor determining a gain of the amplifying circuit, and a position-detecting signal output circuit generating position-detecting signals in accordance with the split detection signals. At least the light-receiving device, the amplifying circuit, and the fixed resistor are integrated on an identical semiconductor substrate.

10 Claims, 5 Drawing Sheets

LIGHT DETECTOR, OPTICAL PICKUP, AND OPTICAL DISC APPARATUS

CROSS REFERENCES TO RELATED APPLICATIONS

The present invention contains subject matter related to Japanese Patent Application JP 2005-020691 filed in the Japanese Patent Office on Jan. 28, 2005, the entire contents of which are incorporated herein by reference.

BACKGROUND OF THE INVENTION

1. Field of the Invention

The present invention relates to optical disc apparatuses that record and play back optical signals onto and from optical recording media, optical pickups used in optical disc apparatuses, and light detectors provided in optical pickups.

2. Description of the Related Art

Optical pickups that record and play back information onto and from optical recording media capable of recording and playback, such as compact disc-recordables (CD-Rs), digital versatile disc ± recordables (DVD±Rs), or digital versatile disc random-access memories (DVD-RAMs), are available.

Such optical pickups perform recording by irradiating an optical recording medium with a light beam from a light source through an objective lens. In order to monitor output power of a light source when recording is being performed, a light detector formed by integrating a light-receiving device that receives a light beam emitted from the light source and a power monitor circuit section that amplifies a detection signal output from the light-receiving device and that generates a power monitor signal on the same semiconductor substrate (semiconductor chip) is proposed (see, for example, Japanese Unexamined Patent Application Publication No. 2003-257070).

In the light detector, the power monitor circuit section includes a current-voltage conversion circuit that converts a detection signal, which is a current signal output from the light-receiving device, into a voltage signal and an amplifying circuit that amplifies the voltage signal.

In addition, in order to adjust the level of a power monitor signal, a variable resistor (volume) for changing the gain of the amplifying circuit is externally disposed with respect to the semiconductor substrate. The variable resistor is mounted on a substrate different from the semiconductor substrate.

SUMMARY OF THE INVENTION

In such a light detector, since the amplifying circuit and the variable resistor are separated from each other, a wire connecting the amplifying circuit to the variable resistor is extended to the outside of the semiconductor substrate. Thus, a capacitance component or an inductance component is generated in a wiring portion, and this configuration is disadvantageous in ensuring a frequency characteristic and a signal-to-noise (S/N) ratio of the amplifying circuit.

In recent years, since the speed of recording onto an optical recording medium increases, an increase in the response speed of an amplifying circuit is required. In addition, as a difference between a space for recording and necessary output power of a light source for pit formation increases, a higher S/N ratio of the amplifying circuit is required. In addition, simplification of adjustment of the level of a power monitor signal is required for the purpose of reduction of cost.

It is desirable to provide a light detector that is advantageous in simplifying adjustment of the level of a power monitor signal while increasing the response speed and the S/N ratio of an amplifying circuit in a power monitor circuit section and an optical pickup and an optical disc apparatus using the light detector.

A light detector according to an embodiment of the present invention includes a light-receiving device that receives a light beam applied from a light source irradiating an optical recording medium with the light beam and that generates detection signals, and a power monitor circuit section that generates a power monitor signal for monitoring output power of the light source in accordance with the detection signals. The light-receiving device includes a plurality of split light-receiving elements. The detection signals are output from the plurality of split light-receiving elements as split detection signals. The power monitor circuit section includes an amplifying circuit that amplifies a signal obtained by adding all the plurality of split detection signals to generate the power monitor signal and that outputs the power monitor signal as a first differential signal and a second differential signal whose polarities are opposite to each other, a fixed resistor that determines a gain of the amplifying circuit, and a position-detecting signal output circuit that generates, in accordance with the plurality of split detection signals, a first position-detecting signal and a second position-detecting signal identifying a position of a light spot on a light-receiving surface of the light-receiving device formed by application of the light beam to the light-receiving surface. At least the light-receiving device, the amplifying circuit, and the fixed resistor are integrated on an identical semiconductor substrate.

An optical pickup according to an embodiment of the present invention includes a light source that emits a light beam, an objective lens that condenses the light beam emitted from the light source and that irradiates an optical recording medium with the light beam, a first light detector that receives via the objective lens a reflected light beam formed by reflection of the light beam applied from the light source by the optical recording medium, and a second light detector that receives the light beam applied from the light source for monitoring output power of the light source. The second light detector includes a light-receiving device that receives the light beam applied from the light source to generate detection signals, and a power monitor circuit section that generates a power monitor signal for monitoring the output power of the light source in accordance with the detection signals. The light-receiving device includes a plurality of split light-receiving elements. The detection signals are output from the plurality of split light-receiving elements as split detection signals. The power monitor circuit section includes an amplifying circuit that amplifies a signal obtained by adding all the plurality of split detection signals to generate the power monitor signal and that outputs the power monitor signal as a first differential signal and a second differential signal whose polarities are opposite to each other, a fixed resistor that determines a gain of the amplifying circuit, and a position-detecting signal output circuit that generates, in accordance with the plurality of split detection signals, a first position-detecting signal and a second position-detecting signal identifying a position of a light spot on a light-receiving surface of the light-receiving device formed by application of the light beam to the light-receiving surface. At least the light-receiving device, the amplifying circuit, and the fixed resistor are integrated on an identical semiconductor substrate.

An optical disc apparatus according to an embodiment of the present invention includes driving means for holding and rotating an optical recording medium, and an optical pickup that irradiates the optical recording medium rotated by the driving means with a light beam for recording and/or playback and that detects a reflective light beam formed by reflection of the light beam by the optical recording medium. The optical pickup includes a light source that emits the light beam, an objective lens that condenses the light beam emitted from the light source and that irradiates the optical recording medium with the light beam, a first light detector that receives via the objective lens the reflected light beam formed by the reflection of the light beam applied from the light source by the optical recording medium, and a second light detector that receives the light beam applied from the light source for monitoring output power of the light source. The second light detector includes a light-receiving device that receives the light beam applied from the light source to generate detection signals, and a power monitor circuit section that generates a power monitor signal for monitoring the output power of the light source in accordance with the detection signals. The light-receiving device includes a plurality of split light-receiving elements. The detection signals are output from the plurality of split light-receiving elements as split detection signals. The power monitor circuit section includes an amplifying circuit that amplifies a signal obtained by adding all the plurality of split detection signals to generate the power monitor signal and that outputs the power monitor signal as a first differential signal and a second differential signal whose polarities are opposite to each other, a fixed resistor that determines a gain of the amplifying circuit, and a position-detecting signal output circuit that generates, in accordance with the plurality of split detection signals, a first position-detecting signal and a second position-detecting signal identifying a position of a light spot on a light-receiving surface of the light-receiving device formed by application of the light beam to the light-receiving surface. At least the light-receiving device, the amplifying circuit, and the fixed resistor are integrated on an identical semiconductor substrate.

In the light detector, the optical pickup, and the optical disc apparatus, the light-receiving device, the amplifying circuit, and the fixed resistor that sets the gain of the amplifying circuit are integrated on the same semiconductor substrate. Thus, a capacitance component and an inductance component generated by the fixed resistor and wiring of the fixed resistor can be reduced to a negligible level. This is advantageous in increasing the response speed (a frequency characteristic and a setting characteristic) and the S/N ratio of the amplifying circuit in the power monitor circuit section.

In addition, the position of the spot of the main beam on the light-receiving surface of the light-receiving device can be checked in accordance with the first and second position-detecting signals. In addition, the amount of light beam applied to the light-receiving surface of the light-receiving device can be checked in accordance with the first and second differential signals.

Accordingly, an operation for adjusting the amount of light received by the light-receiving surface of the light-receiving device to an appropriate value can be performed easily and efficiently. This is advantageous in simplifying adjustment of the level of the power monitor signal formed by the first and second differential signals.

DESCRIPTION OF THE PREFERRED EMBODIMENTS

In order to simplify adjustment of the level of a power monitor signal while increasing the response speed and the S/N ratio of an amplifying circuit in a power monitor circuit section, at least a light-receiving device for detection signals, the amplifying circuit, and a fixed resistor that sets the gain of the amplifying circuit are integrated on the same semiconductor substrate, and an amplifying circuit and a position-detecting signal output circuit are provided.

First Embodiment

A light detector, an optical pickup, and a recording/playback apparatus according to a first embodiment of the present invention will be described with reference to FIG. 1.

Figure 1:
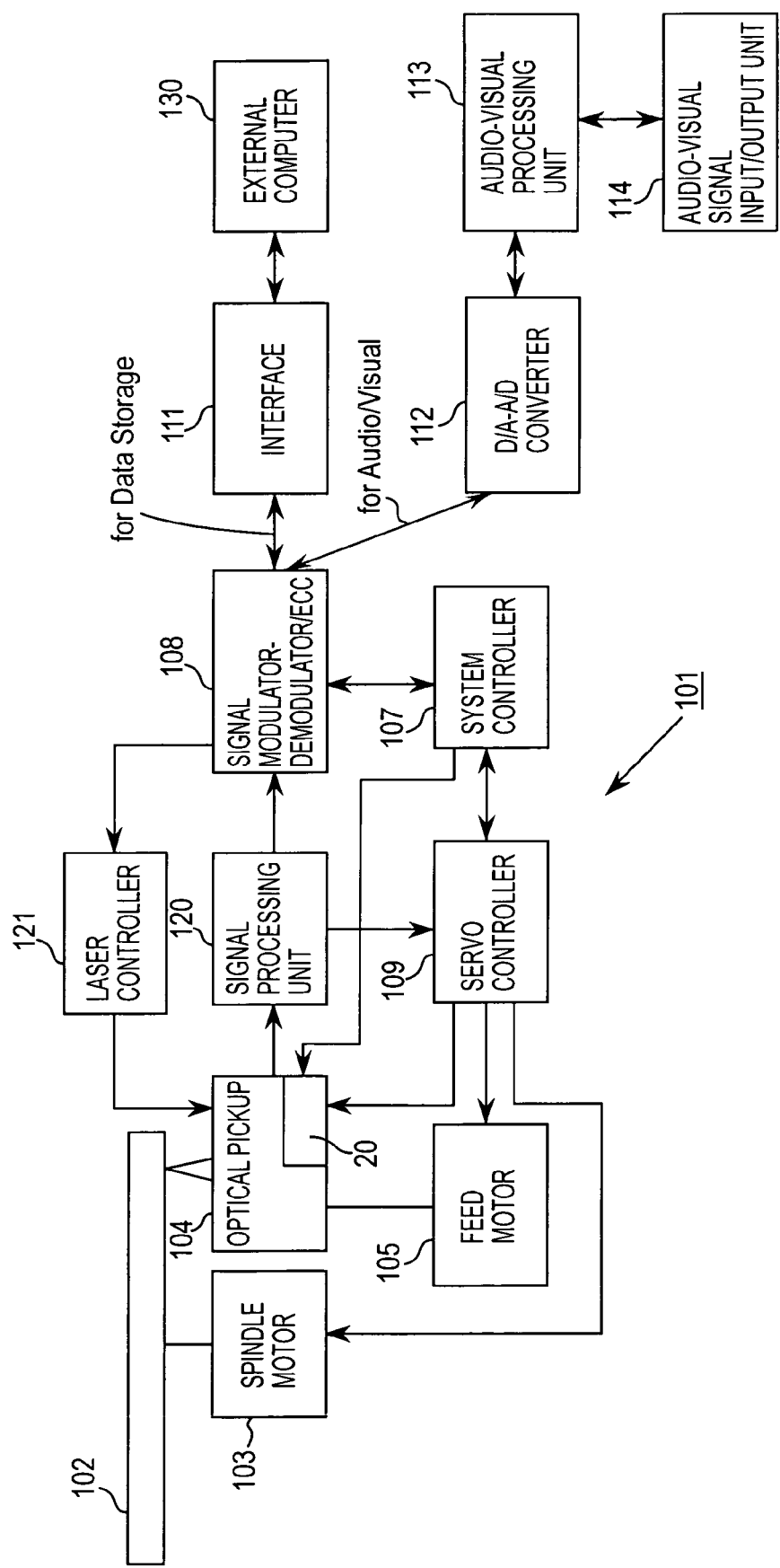
FIG. 1 is a block diagram showing the structure of an optical disc apparatus in which a light detector and an optical pickup according to a first embodiment of the present invention are built.

FIG. 1 is a block diagram showing the structure of an optical disc apparatus 101 in which light detectors and an optical pickup according to the first embodiment are built. The optical disc apparatus 101 shown in FIG. 1 is an example of a recording/playback apparatus on which an optical pickup described below can be mounted.

Referring to FIG. 1, the optical disc apparatus 101 includes a spindle motor 103, an optical pickup 104, and a feed motor 105. The spindle motor 103 is a driving unit that drives and rotates an optical disc, which is an optical recording medium, such as a CD-R, DVD±R, or a DVD-RAM. The feed motor 105 is a driving unit for the optical pickup 104. The spindle motor 103 is configured to rotate at a predetermined rotation speed under the control of a system controller 107 and a servo controller 109.

A signal modulator-demodulator/ECC block 108 modulates and demodulates a signal output from a signal processing unit 120 and adds an error-correcting code (ECC). The optical pickup 104 irradiates a signal recording surface of an optical disc 102 rotating in accordance with an instruction from the system controller 107 and the servo controller 109 with light beams. An optical signal is recorded and played back onto and from the optical disc 102 by such light irradiation.

In addition, the optical pickup 104 is configured to detect various light beams described below in accordance with reflected light beams from the signal recording surface of the optical disc 102 and to supply signals corresponding to the respective light beams to the signal processing unit 120.

The signal processing unit 120 is configured to generate servo control signals, such as a focus error signal, a tracking error signal, an RF signal, a monitor signal (running optimal power control (R-OPC) signal) necessary for R-OPC processing, and an absolute time in pregroove (ATIP) signal necessary for rotation control of an optical disc when recording is being performed, in accordance with detection signals corresponding to the respective light beams. In addition, in accordance with a type of a recording medium to be played back, the servo controller 109, the signal modulator-demodulator/ECC block 108, and the like perform predetermined processing, such as demodulation and error correction, based on such signals.

If a recording signal demodulated by the signal modulator-demodulator/ECC block 108 is a signal for data storage in a computer, the recording signal is sent to an external computer 130 or the like via an interface 111. Accordingly, the external computer 130 or the like is configured to receive a signal recorded on the optical disc 102 as a playback signal.

If a recording signal demodulated by the signal modulator-demodulator/ECC block 108 is an audio-visual signal, the recording signal is digital-to-analog converted by a digital-to-analog (D/A) conversion unit of a digital-to-analog (D/A)-analog-to-digital (A/D) converter 112, and the converted signal is supplied to an audio-visual processing unit 113. The supplied converted signal is subjected to audio-video signal processing by the audio-visual processing unit 113, and the processed signal is transmitted to an external image pickup/projecting apparatus via an audio-visual signal input/output unit 114.

The optical pickup 104 is connected to the feed motor 105 for moving the optical pickup 104, for example, to a predetermined recording track on the optical disc 102. The servo controller 109 controls the spindle motor 103 and the feed motor 105. The servo controller 109 also controls a focusing direction and a tracking direction of an actuator holding an objective lens of the optical pickup 104.

In other words, the servo controller 109 controls the spindle motor 103 in accordance with an ATIP signal, and controls the actuator in accordance with a focus error signal and a tracking error signal.

In addition, a laser controller 121 controls a light source (a laser source) of the optical pickup 104. The laser controller 121 also controls output power (outgoing power) of the laser source in accordance with a power monitor signal supplied from a power monitor circuit section 200, which will be described below.

Figure 2:
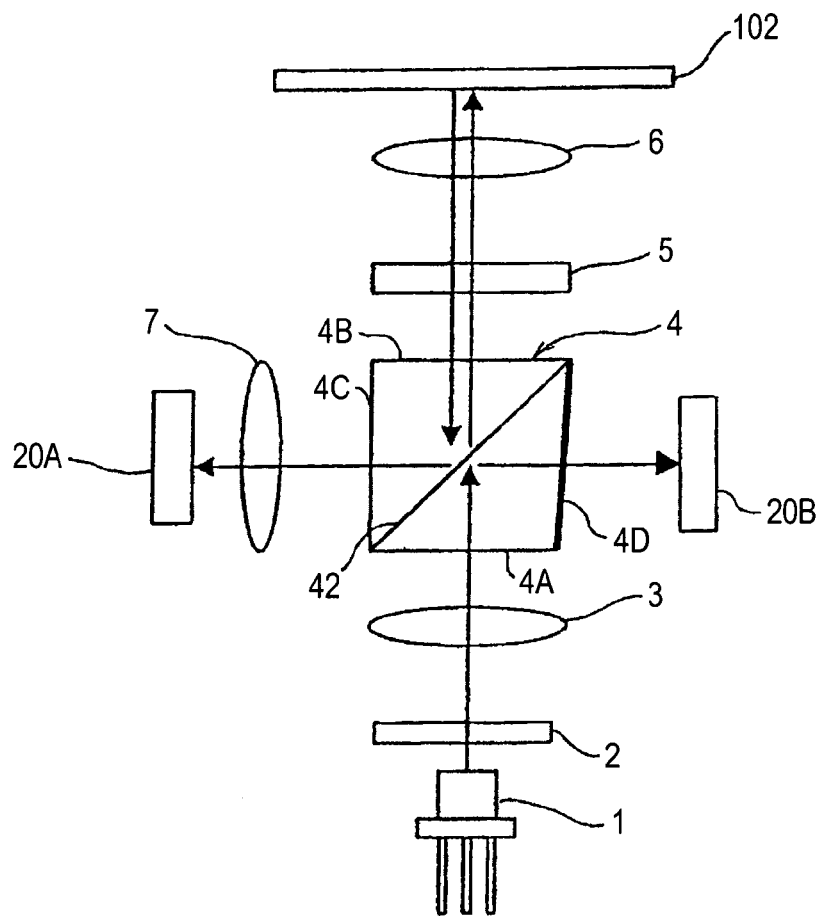
FIG. 2 shows the structure of an optical system of the optical pickup according to the first embodiment.

FIG. 2 shows the structure of an optical system of the optical pickup 104 according to the first embodiment.

As shown in FIG. 2, the optical pickup 104 includes a light source 1, a grating element 2, a collimator lens 3, a polarization beam splitter 4, a quarter-wave plate 5, an objective lens 6, a condenser lens 7, a first light detector 20A, and a second light detector 20B. These component parts are mounted on a holder, which is not shown.

The grating element 2, the collimator lens 3, the polarization beam splitter 4, the quarter-wave plate 5, and the objective lens 6 are aligned along a line in that order in front of the light source 1. The optical disc 102 is disposed in front of the objective lens 6.

The polarization beam splitter 4 has a first plane 4A facing the light source 1, a second plane 4B opposing the first plane 4A and facing the objective lens 6, a third plane 4C orthogonal to the first plane 4A and the second plane 4B, a fourth plane 4D opposing the third plane 4C, and a plane of polarization 42 having about forty-five degrees with respect to the first plane 4A and the second plane 4B.

The first light detector 20A is disposed so as to face the third plane 4C of the polarization beam splitter 4. The second light detector 20B is disposed so as to face the fourth plane 4D of the polarization beam splitter 4. The light detectors according to the first embodiment are configured as described above.

In the optical pickup 104, a light beam emitted from the light source 1 passes through the grating element 2 to be divided into a main beam component and two sub-beam components, and the main beam component and the sub-beam components are incident to the polarization beam splitter 4 through the collimator lens 3.

Part of the light beam incident to the first plane 4A of the polarization beam splitter 4 passes through the plane of polarization 42 and the second plane 4B, and is applied to the optical disc 102 through the quarter-wave plate 5 and the objective lens 6. The rest of the light beam incident to the polarization beam splitter 4 is reflected by the plane of polarization 42 of the polarization beam splitter 4.

The light beam reaching the optical disc 102 is reflected by the recording surface of the optical disc 102, and is incident to the second plane 4B of the polarization beam splitter 4 through the objective lens 6 and the quarter-wave plate 5 as a reflected light beam. Then, the reflected light beam is reflected by the plane of polarization 42, and is incident to the first light detector 20A through the third plane 4C.

In addition, the light beam reflected by the plane of polarization 42 is incident to the second light detector 20B through the fourth plane 4D.

Detection of tracking errors and focus errors can be performed by various known methods. In the first embodiment, tracking error signals are detected by a differential push-pull (DPP) method or a differential phase detection (DPD) method, and focus error signals are detected by an astigmatism method.

The first light detector 20A is described next. The structure of the first light detector 20A is not directly relevant to the outline of the present invention. The first light detector 20A can have various known structures.

Figure 3:
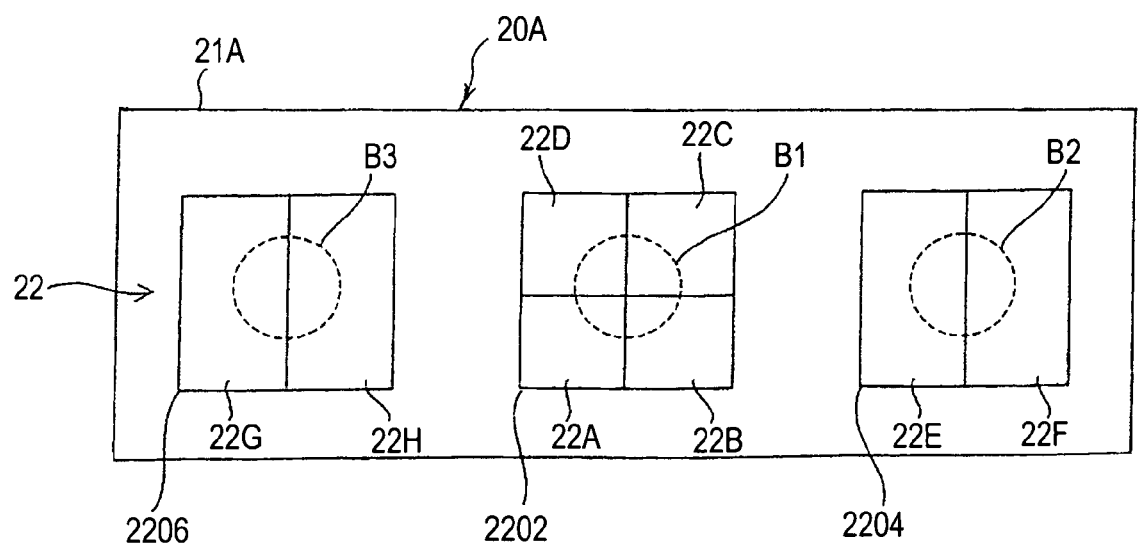
FIG. 3 is a plan view of a first light detector.
Figure 4:
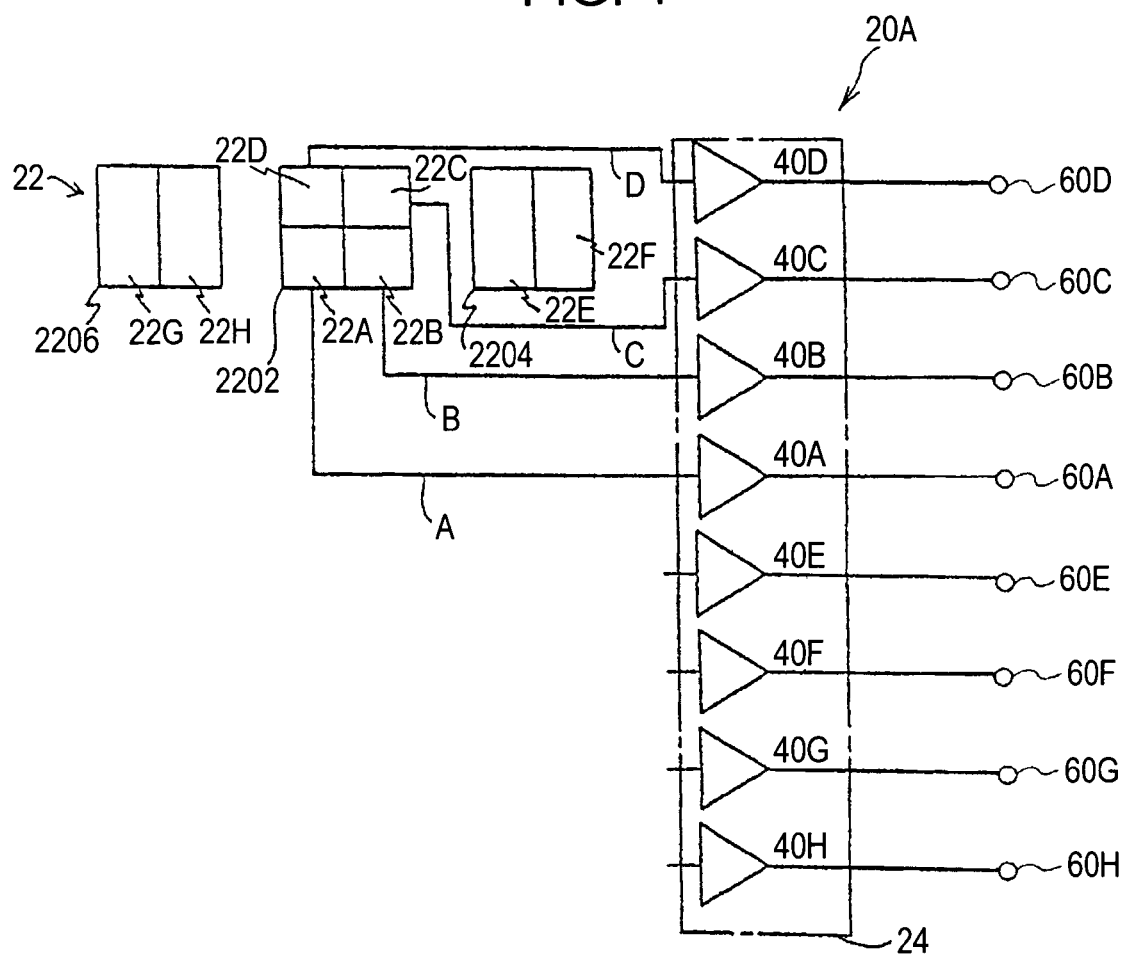
FIG. 4 is a circuit diagram showing the structure of the first light detector.

FIG. 3 is a plan view of the first light detector 20A, and FIG. 4 is a circuit diagram showing the structure of the first light detector 20A.

As shown in FIGS. 3 and 4, the first light detector 20A includes a light-receiving device 22 for playback signals, a playback signal amplifying circuit 24, eight output terminals 60A to 60H. The light-receiving device 22, the playback signal amplifying circuit 24, and the output terminals 60A to 60H are mounted on a semiconductor substrate 21A.

As shown in FIG. 3, the light-receiving device 22 includes a first light-receiving part 2202, a second light-receiving part 2204, and a third light-receiving part 2206 that are aligned along a line with a space therebetween on the semiconductor substrate 21A.

The first light-receiving part 2202, which is located at the center of the three light-receiving parts, receives a main beam component B1 of the reflected light beam. The first light-receiving part 2202 has a single light-receiving surface of a rectangular shape divided into four areas having the same dimensions by an insulator (non-conductor) formed in a cross shape and includes four split light-receiving elements 22A to 22D.

The second light-receiving part 2204, which is located on one side of the first light-receiving part 2202, receives a sub-beam component B2, which is one of two sub-beam components of the reflected light beam. The second light-receiving part 2204 has a rectangular shape divided into two areas having the same dimensions by a linear insulator extending in a direction orthogonal to the line along which the first light-receiving part 2202, the second light-receiving part 2204, and the third light-receiving part 2206 are aligned. The second light-receiving part 2204 includes a split light-receiving element 22E disposed near the first light-receiving part 2202 and a split light-receiving element 22F disposed remote from the first light-receiving part 2202.

The third light-receiving part 2206, which is located on the other side of the first light-receiving part 2202, receives a sub-beam component B3, which is the other one of the two sub-beam components of the reflected light beam. The third light-receiving part 2206 has a rectangular shape divided into two areas having the same dimensions by a linear insulator extending in the direction orthogonal to the line along which the first light-receiving part 2202, the second light-receiving part 2204, and the third light-receiving part 2206 are aligned, similarly to the second light-receiving part 2204. The third light-receiving part 2206 includes a split light-receiving element 22H disposed near the first light-receiving part 2202 and a split light-receiving element 22G disposed remote from the first light-receiving part 2202.

The split light-receiving elements 22A to 22H are configured to output current signals corresponding to the amounts of received light as split playback current signals A to H, respectively.

In addition, positions of spots of the main beam component and the two sub-beam components of the reflected light beam formed on the light-receiving surfaces of the first light-receiving part 2202, the second light-receiving part 2204, and the third light-receiving part 2206 of the light-receiving device 22 are adjusted by moving the first light detector 20A on the holder.

As shown in FIG. 4, the playback signal amplifying circuit 24 includes eight I/V amplifiers (current/voltage amplifiers) 40A to 40H that amplify the split playback current signals A to H and that output the amplified split playback current signals A to H as split playback voltage signals A to H.

In FIG. 4, in order to avoid a complicated drawing, wiring of the I/V amplifiers 40E to 40H is omitted.

The second light detector 20B will now be described.

Figure 5:
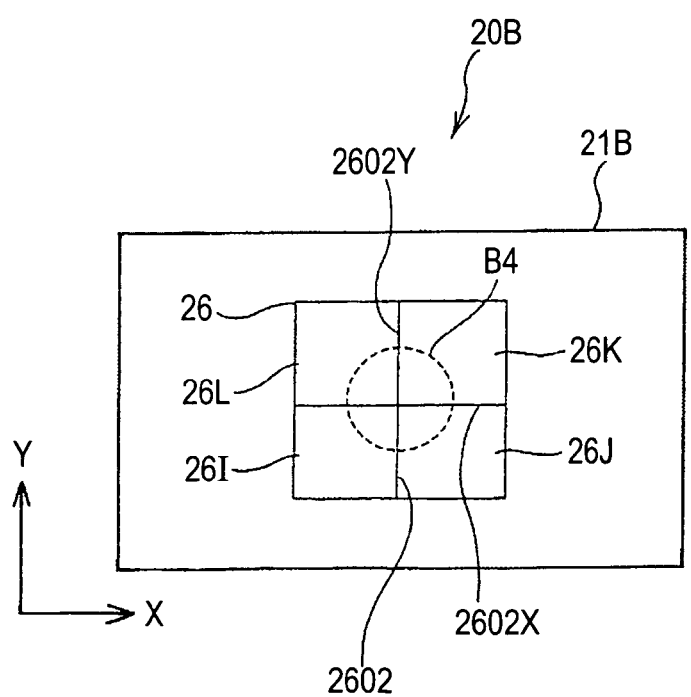
FIG. 5 is a plan view of a second light detector.
Figure 6:
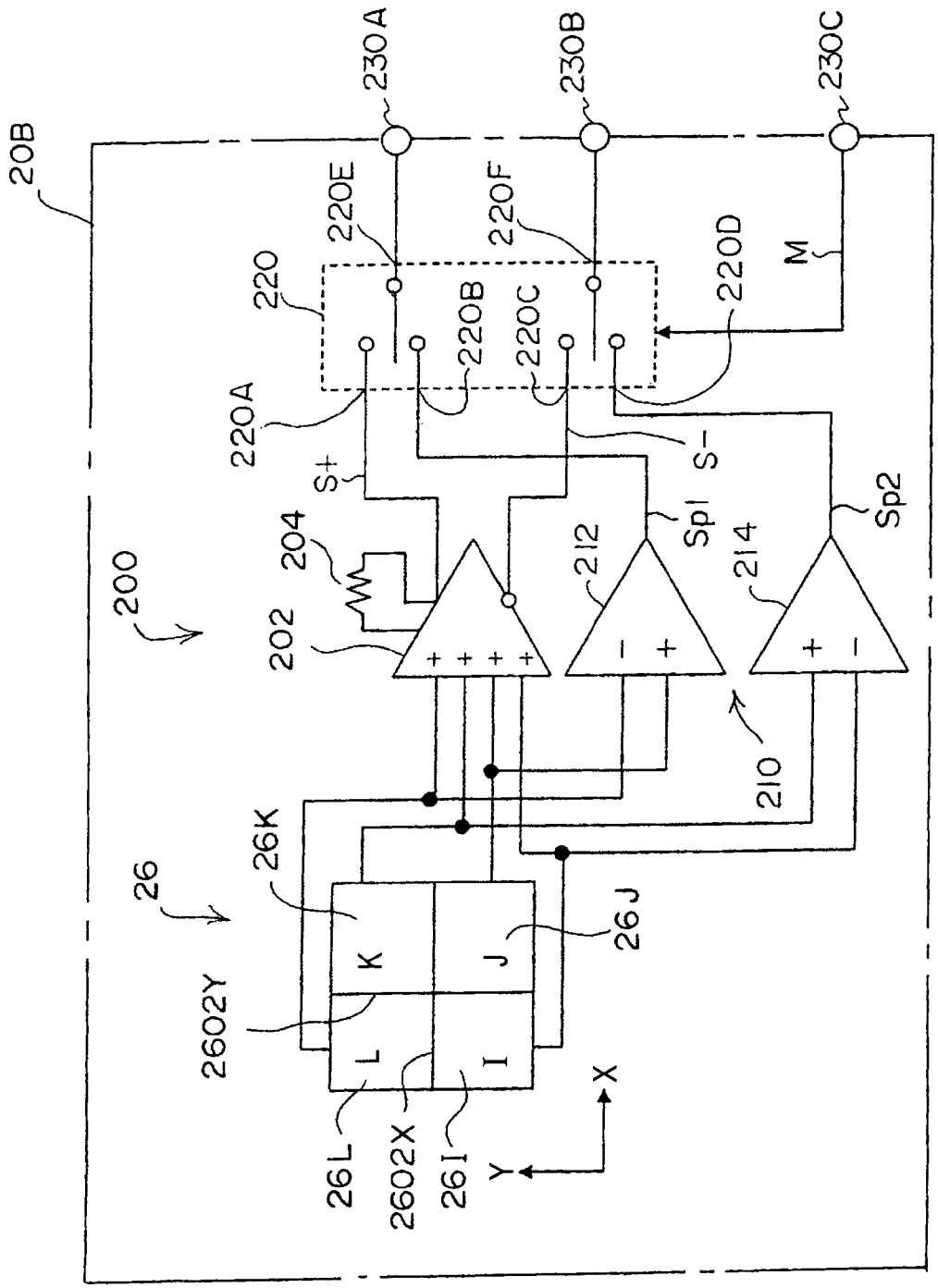
FIG. 6 is a circuit diagram showing the structure of the second light detector.

FIG. 5 is a plan view of the second light detector 20B, and FIG. 6 is a circuit diagram showing the structure of the second light detector 20B.

The second light detector 20B includes a light-receiving device 26 for detection signals for monitoring output power of the light source 1 and the power monitor circuit section 200 that generates a power monitor signal in accordance with detection signals supplied from the light-receiving device 26. The light-receiving device 26 and the power monitor circuit section 200 are integrated on a semiconductor substrate 21B, which is provided separately from the semiconductor substrate 21A of the first light-detecting device 20A.

The light-receiving device 26 receives a main beam component B4 of the light beam guided by the polarization beam splitter 4. The light-receiving device 26 has a single light-receiving surface of a rectangular shape divided into four areas by an insulator 2602 formed in a cross shape, similarly to the first light-receiving part 2202, and includes four split light-receiving elements 26I to 26L.

More specifically, the four split light-receiving elements 26I to 26L are formed centered on a point at substantially the center of the outline of the light-receiving surface of the light-receiving device 26 so as to be equally spaced (at ninety degrees) around the point. In the first embodiment, the split light-receiving elements 26I to 26L have rectangular light-receiving surface components, which are first to fourth light-receiving surface components, respectively, having the same dimensions. In other words, based on a point at substantially the center of the outline of the light-receiving surface of the light-receiving device 26 as the center of symmetry, the light-receiving surface components of the two split light-receiving elements 26I and 26K are disposed at positions symmetrical with respect to the point, and the light-receiving surface components of the left two split light-receiving elements 26J and 26L are disposed at positions symmetrical with respect to the point.

In the first embodiment, as shown in FIG. 6, the insulator 2602 formed in a cross shape includes a first insulator component 2602X disposed along an X-axis and a second insulator component 2602Y disposed along a Y-axis that are orthogonal to each other.

The four split light-receiving elements 26I to 26L are configured to output current signals corresponding to the amounts of received light as split detection signals I to L, respectively.

The position of a spot of the main beam component B4 in the X-axis direction and the Y-axis direction on the light-receiving surface can be identified in accordance with the split detection signals I to L.

In other words, as is clear from FIG. 6, if "J+K" is equal to "I+L", the spot of the main beam component is located at the center of the light-receiving surface in the X-axis direction. If "J+K" is larger or smaller than "I+L", the spot of the main beam component is located at a position more distant from the center of the light-receiving surface in the X-axis direction as the difference between "J+K" and "I+L" increases.

Similarly, if "J+I" is equal to "K+L", the spot of the main beam component is located at the center of the light-receiving surface in the Y-axis direction. If "J+I" is larger or smaller than "K+L", the spot of the main beam component is located at a position more distant from the center of the light-receiving surface in the Y-axis direction as the difference between "J+I" and "K+L" increases.

In addition, the position of the spot of the light beam component formed on the light-receiving surface of the light-receiving device 26 is adjusted along the light-receiving surface by moving the second light detector 20B (that is, the semiconductor substrate 21B) using an adjusting jig or the like.

The power monitor circuit section 200 includes an amplifying circuit 202, a fixed resistor 204, a position-detecting signal output circuit 210, and an output selection circuit 220. As described above, since the power monitor circuit section 200 is integrated on the semiconductor substrate 21B, the amplifying circuit 202, the fixed resistor 204, the position-detecting signal output circuit 210, and the output selection circuit 220 are integrated on the semiconductor substrate 21B.

The amplifying circuit 202 is configured to amplify a signal "I+J+K+L" obtained by adding all the four split detection signals I, J, K, and L at a gain of $\alpha$ to generate a power monitor signal and to output the power monitor signal as a first differential signal S+ and a second differential signal S− whose polarities are opposite to each other. More specifically, the first differential signal S+ is represented by "$\alpha(I+J+K+L)$", and the second differential signal S− is represented by "$-\alpha(I+J+K+L)$".

Various known circuitry can be applied to the circuit structure of the amplifying circuit 202.

If a power monitor signal is output as differential signals as described above, speed up of detection signals can be handled more satisfactorily compared with a case where a power monitor signal is not output as differential signals. This is advantageous in ensuring the quality of a recording signal or a playback signal when recording and/or playback onto and/or from an optical recording medium having a high recording density, such as a DVD, is performed.

The fixed resistor 204 determines the gain a of the amplifying circuit 202 in accordance with the circuit structure of the amplifying circuit 202.

The position-detecting signal output circuit 210 is configured to generate a first position-detecting signal Sp1 and a second position-detecting signal Sp2 that identify the position of a light spot on a light-receiving surface of the light-receiving device 26 formed by irradiating the light-receiving surface with the main beam component B4 in accordance with the four split detection signals I, J, K, and L.

In the first embodiment, the position-detecting signal output circuit 210 includes a first amplifier 212 and a second amplifier 214.

The first amplifier 212 is configured to output the first position-detecting signal Sp1 in accordance with a differential signal "J–L", which represents a difference between the second split detection signal J and the fourth split detection signal L. The second amplifier 214 is configured to output the second position-detecting signal Sp2 in accordance with a differential signal "K–I", which represents a difference between the third split detection signal K and the first split detection signal I.

The output selection circuit 220 includes first and second input terminals 220A and 220C that receive the first and second differential signals S+ and S–, respectively, third and fourth input terminals 220B and 220D that receive the first and second position-detecting signals Sp1="J–L" and Sp2="K–I", respectively, and first and second output terminals 220E and 220F. The first and second output terminals 220E and 220F are connected to first and second output terminals 230A and 230B of the second light detector 20B, respectively.

The output selection circuit 220 is configured to select, in accordance with a mode-setting signal M input from a mode signal input terminal 230 C of the second light detector 20B, a power monitor signal output mode in which the first and second differential signals S+ and S– are output at the same time from the first and second output terminals 220E and 220F, respectively, or a positioning mode (that is, an alignment (AL) mode) in which the first and second position-detecting signals Sp1 and Sp2 are output at the same time from the first and second output terminals 220E and 220F, respectively.

In the first embodiment, the mode-setting signal M has a value of "H" or "L". The output selection circuit 220 is configured to select the power monitor signal output mode when the mode-setting signal M is "H" and to select the positioning mode when the mode-setting signal M is "L".

The split detection signals I to L, the power monitor signal, and the first and second differential signals may be handled as voltage signals. Alternatively, the split detection signals I to L, the power monitor signal, and the first and second differential signals may be handled as current signals. If such signals are handled as voltage signals, the amplifying circuit 202 and the first and second amplifiers 212 and 214 may be provided with current-voltage converters. If such signals are handled as current signals, the amplifying circuit 202 and the first and second amplifiers 212 and 214 may be operated by current signals.

Positioning adjustment of the first light detector 20A is described next.

Positioning is performed such that spots of a main beam component and two sub-beam components are accurately positioned with respect to the first light-receiving part 2202, the second light-receiving part 2204, and the third light-receiving part 2206 of the light-receiving device 22.

In this case, split playback voltage signals A to H are output to the output terminals 60A to 60H.

Then, in a state in which the split playback voltage signals A to H are output (spots of light beam components are positioned on the respective light-receiving parts for playback signals), four differential signals "A–C", "B–D", "E–F", and "G–H" are detected in accordance with the split playback voltage signals A to H. When each of the differential signals "A–C" and "B–D" reaches its minimum value, the main beam component is accurately positioned on the first light-receiving part 2202. When the differential signal "E–F" reaches its minimum value, one of the sub-beam components is accurately positioned on the second light-receiving part 2204. When the differential signal "G–H" reaches its minimum value, the other one of the sub-beam components is accurately positioned on the third light-receiving part 2206.

Thus, when the position of the first light detector 20A (that is, the semiconductor substrate 21A) is moved on the holder such that each of the differential signals "A–C", "B–D", "E–F", and "G–H" reaches its minimum value and each of the differential signals "A–C", "B–D", "E–F", and "G–H" has a value of 0, spots of the main beam component and the sub-beam components with respect to the first light-receiving part 2202, the second light-receiving part 2204, and the third light-receiving part 2206 can be accurately positioned. In such a state, the first light detector 20A (that is, the semiconductor substrate 21A) is fixed to the holder with an adhesive or the like.

Positioning of the second light detector 20B will now be described.

Unlike positioning of the first light detector 20A, positioning of the second light detector 20B is not performed such that the spot of the main beam component B4 is accurately positioned with respect to the center of the light-receiving surface of the light-receiving device 26. Positioning of the second light detector 20B is performed such that the amount of light received on the light-receiving surface of the light-receiving device 26 is adjusted based on the spot of the main beam component B4 of the light beam.

In other words, the dimensions of areas of the spot of the main beam component B4 inside and outside the outline of the light-receiving surface of the light-receiving device 26 are increased or decreased, so that the amount of light received on the light-receiving surface of the light-receiving device 26 is adjusted based on the spot of the main beam component B4 of the light beam.

Accordingly, the level of a power monitor signal (that is, first and second differential signals S+ and S–) output from the amplifying circuit 202 is adjusted. This is because a resistance for setting the gain of the amplifying circuit 202 is fixed by the fixed resistor 204, as described above.

Figure 7:
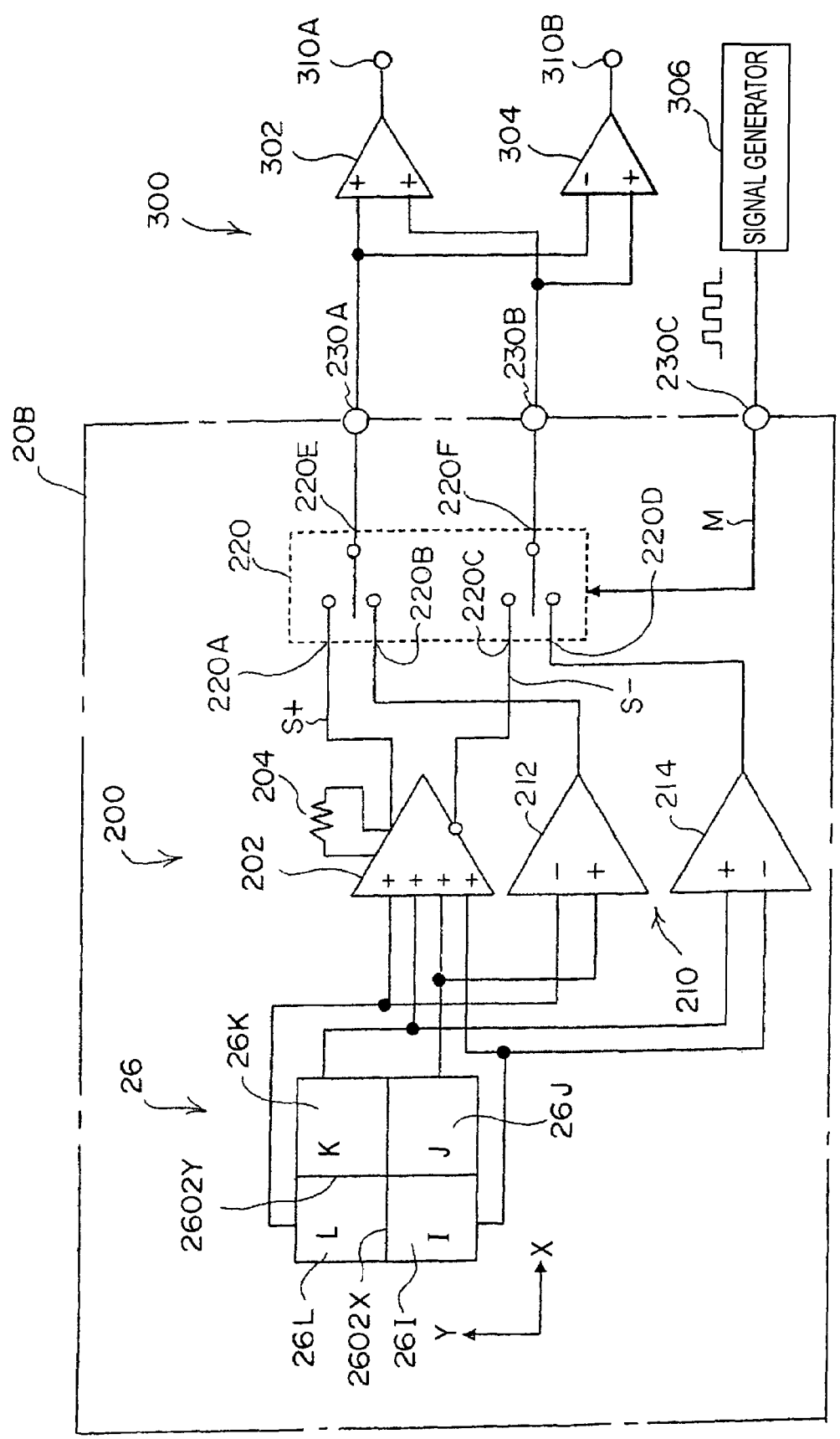
FIG. 7 illustrates an adjusting operation.

As shown in FIG. 7, a signal-adjusting jig 300 is connected to the second light detector 20B.

The signal-adjusting jig 300 includes an adding circuit 302, a subtracting circuit 304, and a signal generator 306.

The adding circuit 302 is configured to add signals supplied from the first and second output terminals 230A and 230B of the second light detector 20B and to output the sum via a first output terminal 310A.

The subtracting circuit 304 is configured to calculate a difference between the signals supplied from the first and second output terminals 230A and 230B and to output the difference via a second output terminal 310B.

The signal generator 306 is configured to supply a rectangular wave signal having a value of "H", or "L" as a mode-setting signal M to an input terminal 230C of the second light detector 20B.

When a mode-setting signal M is input to the input terminal 230C by the signal-adjusting jig 300, during a period in which the mode-setting signal M is "H", the output selection circuit 220 enters the power monitor signal output mode. Thus, the subtracting circuit 304 outputs a signal proportional to a power monitor signal (hereinafter, referred to as a level signal), which represents a difference between first and second differential signals S+ and S–, in other words, a difference between the absolute value of the first differential signal S+ and the absolute value of the second differential signal S– (that is, $(S+)-(S-)=\alpha(I+J+K+L)-(-\alpha(I+J+K+L))=2\alpha(I+J+$ K+L)), via the second output terminal 310B. In this case, the sum of the first and second differential signals S+ and S− output from the adding circuit 302 is not used.

In contrast, during a period in which the mode-setting signal M is "L", the output selection circuit 220 enters the positioning mode. Thus, the adding circuit 302 outputs a sum Sx of the first position-detecting signal Sp1 and the second position-detecting signal Sp2 via the first output terminal 310A, and the subtracting circuit 304 outputs a difference Sy between the first position-detecting signal Sp1 and the second position-detecting signal Sp2 via the second output terminal 310B.

Here, the sum Sx of the first position-detecting signal Sp1 and the second position-detecting signal Sp2 is represented by condition (1), and the difference Sy between the first position-detecting signal Sp1 and the second position-detecting signal Sp2 is represented by condition (2).

$$Sx=Sp1+Sp2=(J-L)+(K-I)=(J+K)-(I+L) \quad (1)$$

$$Sy=Sp1-Sp2=(J-L)-(K-I)=(J+I)-(K+L) \quad (2)$$

In other words, as is clear form FIG. 6, the value Sx=(J+K)−(I+L) represents the position of a spot of a main beam component in the X-axis direction, and the value Sy=(J+1)−(K+L) represents the position of the spot of the main beam component in the Y-axis direction.

That is, during the period in which a mode-setting signal M is "H", a level signal whose size is proportional to the size of a power monitor signal is output from the second output terminal 310B.

In addition, during the period in which a mode-setting signal M is "L", an X-axis direction position-detecting signal Sx representing the position of the spot of the main beam component in the X-axis direction is output from the first output terminal 310A, and at the same time, a Y-axis direction position-detecting signal Sy representing the position of the spot of the main beam component in the Y-axis direction is output from the second output terminal 310B.

Thus, the amount of light received on the light-receiving surface of the light-receiving device 26 is adjusted to an appropriate value by moving the position of the second light detector 20B (that is, the semiconductor substrate 21B) using an adjusting jig or the like such that the level of a power monitor signal has a desired value while checking the position of the spot of the main beam component B4 of the light beam using the position-detecting signals Sx and Sy.

Thus, after the positioning adjustment is completed, the second light detector 20B (that is, the semiconductor substrate 21B) is fixed to the holder in that state using an adhesive or the like.

According to the first embodiment, since the light-receiving device 26, the amplifying circuit 202, and the fixed resistor 204 for setting the gain α of the amplifying circuit 202 are integrated on the semiconductor substrate 21B, a capacitance component and an inductance component generated by the fixed resistor 204 and wiring of the fixed resistor 204 can be reduced to a negligible level. This is advantageous in increasing the response speed (that is, a frequency characteristic and a setting characteristic) and the S/N ratio of the amplifying circuit 202 in the power monitor circuit section 200.

In addition, according to the first embodiment, due to selection between the power monitor signal output mode and the positioning mode of the output selection circuit 220, the position of the spot of the main beam component B4 on the light-receiving surface of the light-receiving device 26 can be checked in accordance with the first and second position-detecting signals Sp1 and Sp2, and the amount of light beam applied to the light-receiving surface of the light-receiving device 26 can be checked in accordance with the first and second differential signals S+ and S−.

Thus, an operation for adjusting the amount of light received on the light-receiving surface of the light-receiving device 26 can be performed easily and efficiently. This is advantageous in simplifying level adjustment of a power monitor signal formed by the first and second differential signal S+ and S−.

In the first embodiment, a case where the light-receiving device 26, the amplifying circuit 202, the fixed resistor 204, the position-detecting signal output circuit 210, and the output selection circuit 220 are integrated on the semiconductor substrate 21B is described. However, if at least the light-receiving device 26, the amplifying circuit 202, and the fixed resistor 204 are integrated on the semiconductor substrate 21B, a capacitance component and an inductance component generated by the fixed resistor 204 can be reduced, thus being advantageous in increasing the response speed and the S/N ratio of the amplifying circuit 202 in the power monitor circuit section 200.

However, if the light-receiving device 26, the amplifying circuit 202, the fixed resistor 204, the position-detecting signal output circuit 210, and the output selection circuit 220 are integrated on the semiconductor substrate 21B as in the first embodiment, the first and second position-detecting signals Sp1 and Sp2 or the first and second differential signals S+ and S− can be selectively output to the outside via the first and second output terminals 230A and 230B of the output selection circuit 220. This is advantageous in suppressing an increase in the number of output terminals and in reducing the cost.

In addition, a case where the position of the spot of the main beam component B4 on the light-receiving surface of the light-receiving device 26 is checked in accordance with an X-direction position-detecting signal Sx, which represents the sum of first and second position-detecting signals Sp1 and Sp2 calculated by the adding circuit 302, and a Y-direction position-detecting signal Sy, which represents the difference between the first and second position-detecting signals Sp1 and Sp2 calculated by the subtracting circuit 304, is described in the first embodiment. However, the adding circuit 302 and the subtracting circuit 304 may be built in the position-detecting signal output circuit 210 so that the position-detecting signal output circuit 210 is capable of directly generating the position-detecting signals Sx and Sy. In addition, the adding circuit 302 and the subtracting circuit 304 may be built in the optical pickup 104 or the optical disc apparatus 101.

However, since such a positioning operation is performed only when an optical pickup is manufactured, by providing the adding circuit 302 and the subtracting circuit 304 as a jig, as in the first embodiment, the structure of the power monitor circuit section 200 including the position-detecting signal output circuit 210 can be simplified. This is advantageous in reducing the cost and size.

In addition, in order to simplify the explanation, a case where the gain α of the amplifying circuit 202 is fixed to a value by the fixed resistor 204 is described in the first embodiment. However, for an optical pickup selectively using light sources having different wavelengths and outgoing power in accordance with the type of an optical disc (for example, a CD-R or DVD+R), the gain of the amplifying circuit 202 needs to be changed depending on the light source used.

For example, for an optical pickup selectively using two types of light sources, the amplifying circuit 202 is configured as described below.

The amplifying circuit 202 has a two-stage structure including an up-stream amplifier section formed by a current-voltage amplifier that adds four split detection signals I to L and amplifies the added signal and a down-stream amplifier section formed by first and second down-stream amplifiers that are connected in parallel to an output terminal of the current-voltage amplifier.

The first down-stream amplifier corresponds to one of the light sources. A high response speed and a high S/N ratio are required. For example, the first down-stream amplifier operates when recording and/or playback of a DVD±R is being performed. As in the first embodiment, the gain α is fixed by the fixed resistor 204. The fixed resistor 204 is integrated on the semiconductor substrate 21B.

The second down-stream amplifier corresponds to the other one of the light sources. The response speed and the S/N ratio may be relatively low. For example, the second down-stream amplifier operates when recording and/or playback of a CD-R is being performed. As in a known example, the gain α can be adjusted by a variable resistor externally disposed with respect to the semiconductor substrate 21B.

Thus, if the one of the light sources is used, the level of a power monitor signal can be set to a desired value by adjusting the amount of light beam that is formed by the one of the light sources and that is incident to the light-receiving surface of the light-receiving device 26 in a method similar to the first embodiment.

In contrast, if the other one of the light sources is used, the level of a power monitor signal can be set to a desired value by adjusting a variable resistor of the second down-stream amplifier in a state in which a light beam formed by the other one of the light sources is incident to the light-receiving surface of the light-receiving device 26.

In addition, in the first embodiment, the four split light-receiving elements 26I to 26L are formed around a point at substantially the center of the outline of the single light-receiving surface of the light-receiving device 26 and the split light-receiving elements 26I t 26L are square-shaped having the same dimensions. However, the light-receiving device 26 may be configured as describe below.

The light-receiving device 26 may include three split light-receiving elements. Alternatively, the light-receiving element 26 may include five or more split light-receiving elements. In addition, each of the light-receiving elements is not necessarily square-shaped. For example, each of the split light-receiving elements may be rectangular, triangular, polygonal, circular, or elliptical. In addition, the dimensions of the split light-receiving elements may be different from each other.

In addition, a case where the polarization beam splitter 4 is used as an optical path forming unit that forms an optical path guiding a light beam emitted from the light source 1 to the second light detector 20B is described in the first embodiment. However, obviously, a known optical component, such as a mirror or a prism, may be used as the optical path forming unit.

In addition, a case where the amount of light received on the light-receiving surface of the light-receiving device 26 is adjusted by moving the second light detector 20B is described in the first embodiment. However, obviously, the amount of light received on the light-receiving surface of the light-receiving device 26 may be adjusted by moving an optical component, such as a mirror or a prism, constituting the optical path forming unit.

In addition, the optical pickup 104 in the first embodiment adopts a so-called three-beam system using a main beam component and two sub-beam components. However, obviously, the present invention is not limited to this. For example, the optical pickup 104 adopts a one-beam system or a multi-beam system using four or more beam components.

It should be understood by those skilled in the art that various modifications, combinations, sub-combinations and alterations may occur depending on design requirements and other factors insofar as they are within the scope of the appended claims or the equivalents thereof.

What is claimed is:

1. A light detector comprising:
   a light-receiving device that receives a light beam applied from a light source irradiating an optical recording medium with the light beam and that generates detection signals; and
   a power monitor circuit section that generates a power monitor signal for monitoring output power of the light source in accordance with the detection signals,
   wherein the light-receiving device includes a plurality of split light-receiving elements,
   wherein the detection signals are output from the plurality of split light-receiving elements as split detection signals,
   wherein the power monitor circuit section includes an amplifying circuit that amplifies a signal obtained by adding all the plurality of split detection signals to generate the power monitor signal and that outputs the power monitor signal as a first differential signal and a second differential signal whose polarities are opposite to each other, a fixed resistor that determines a gain of the amplifying circuit, and a position-detecting signal output circuit that generates, in accordance with the plurality of split detection signals, a first position-detecting signal and a second position-detecting signal identifying a position of a light spot on a light-receiving surface of the light-receiving device formed by application of the light beam to the light-receiving surface, and
   wherein at least the light-receiving device, the amplifying circuit, and the fixed resistor are integrated on an identical semiconductor substrate.

2. An optical pickup comprising:
   a light source that emits a light beam;
   an objective lens that condenses the light beam emitted from the light source and that irradiates an optical recording medium with the light beam;
   a first light detector that receives via the objective lens a reflected light beam formed by reflection of the light beam applied from the light source by the optical recording medium; and
   a second light detector that receives the light beam applied from the light source for monitoring output power of the light source,
   wherein the second light detector includes a light-receiving device that receives the light beam applied from the light source to generate detection signals, and a power monitor circuit section that generates a power monitor signal for monitoring the output power of the light source in accordance with the detection signals,
   wherein the light-receiving device includes a plurality of split light-receiving elements,
   wherein the detection signals are output from the plurality of split light-receiving elements as split detection signals,
   wherein the power monitor circuit section includes an amplifying circuit that amplifies a signal obtained by adding all the plurality of split detection signals to generate the power monitor signal and that outputs the power monitor signal as a first differential signal and a second differential signal whose polarities are opposite to each other, a fixed resistor that determines a gain of the amplifying circuit, and a position-detecting signal output circuit that generates, in accordance with the plurality of split detection signals, a first position-detecting signal and a second position-detecting signal identifying a position of a light spot on a light-receiving surface of the light-receiving device formed by application of the light beam to the light-receiving surface, and wherein at least the light-receiving device, the amplifying circuit, and the fixed resistor are integrated on an identical semiconductor substrate.

3. The optical pickup according to claim 2, wherein the position-detecting signal output circuit is integrated on the identical semiconductor substrate.

4. The optical pickup according to claim 2,
wherein the power monitor circuit section further includes an output selection circuit,
wherein the output selection circuit has a first output terminal and a second output terminal, and
wherein the output selection circuit is configured to select one of a power monitor signal output mode in which the first differential signal and the second differential signal are output via the first output terminal and the second output terminal, respectively, and a positioning mode in which the first position-detecting signal and the second position-detecting signal are output via the first output terminal and the second output terminal, respectively.

5. The optical pickup according to claim 2,
wherein the power monitor circuit section further includes an output selection circuit,
wherein the output selection circuit has a first output terminal and a second output terminal,
wherein the output selection circuit is configured to select one of a power monitor signal output mode in which the first differential signal and the second differential signal are output via the first output terminal and the second output terminal, respectively, and a positioning mode in which the first position-detecting signal and the second position-detecting signal are output via the first output terminal and the second output terminal, respectively, and
wherein the position-detecting signal output circuit and the output selection circuit are integrated on the identical semiconductor substrate.

6. The optical pickup according to claim 2,
wherein the plurality of split light-receiving elements is a first split light-receiving element, a second split light-receiving element, a third split light-receiving element, and a fourth split light-receiving element,
wherein the first split light-receiving element, the second split light-receiving element, the third split light-receiving element, and the fourth split light-receiving element have a first light-receiving surface component, a second light-receiving surface component, a third light-receiving surface component, and a fourth light-receiving surface component, respectively, receiving the light beam and having identical dimensions,
wherein the first to fourth split light-receiving elements are arranged in that order centering around a point so as to be insulated from each other,
wherein the first split light-receiving element, the second split light-receiving element, the third split light-receiving element, and the fourth split light-receiving element output the plurality of split detection signals as a first split detection signal, a second split detection signal, a third split detection signal, and a fourth split detection signal, respectively, by receiving the light beam, and wherein the amplifying circuit generates the first and second differential signals in accordance with the signal obtained by adding all the first to fourth split detection signals.

7. The optical pickup according to claim 2,
wherein the plurality of split light-receiving elements is a first split light-receiving element, a second split light-receiving element, a third split light-receiving element, and a fourth split light-receiving element,
wherein the first split light-receiving element, the second split light-receiving element, the third split light-receiving element, and the fourth split light-receiving element have a first light-receiving surface component, a second light-receiving surface component, a third light-receiving surface component, and a fourth light-receiving surface component, respectively, receiving the light beam and having identical dimensions,
wherein the first to fourth split light-receiving elements are arranged in that order centering around a point so as to be insulated from each other,
wherein the first split light-receiving element, the second split light-receiving element, the third split light-receiving element, and the fourth split light-receiving element output the plurality of split detection signals as a first split detection signal, a second split detection signal, a third split detection signal, and a fourth split detection signal, respectively, by receiving the light beam, and
wherein the position-detecting signal output circuit generates the first position-detecting signal in accordance with a differential signal representing a difference between the first split detection signal and the third split detection signal and the second position-detecting signal in accordance with a differential signal representing a difference between the second split detection signal and the fourth split detection signal.

8. The optical pickup according to claim 2,
wherein the output selection circuit has a first input terminal, and
wherein the output selection circuit is configured to select one of the power monitor signal output mode and the positioning mode in accordance with a mode-setting signal input to the first input terminal.

9. An optical disc apparatus comprising:
driving means for holding and rotating an optical recording medium; and
an optical pickup that irradiates the optical recording medium rotated by the driving means with a light beam for recording and/or playback and that detects a reflective light beam formed by reflection of the light beam by the optical recording medium,
wherein the optical pickup includes a light source that emits the light beam, an objective lens that condenses the light beam emitted from the light source and that irradiates the optical recording medium with the light beam, a first light detector that receives via the objective lens the reflected light beam formed by the reflection of the light beam applied from the light source by the optical recording medium, and a second light detector that receives the light beam applied from the light source for monitoring output power of the light source,
wherein the second light detector includes a light-receiving device that receives the light beam applied from the light source to generate detection signals, and a power monitor circuit section that generates a power monitor signal for monitoring the output power of the light source in accordance with the detection signals, wherein the light-receiving device includes a plurality of split light-receiving elements, wherein the detection signals are output from the plurality of split light-receiving elements as split detection signals, wherein the power monitor circuit section includes an amplifying circuit that amplifies a signal obtained by adding all the plurality of split detection signals to generate the power monitor signal and that outputs the power monitor signal as a first differential signal and a second differential signal whose polarities are opposite to each other, a fixed resistor that determines a gain of the amplifying circuit, and a position-detecting signal output circuit that generates, in accordance with the plurality of split detection signals, a first position-detecting signal and a second position-detecting signal identifying a position of a light spot on a light-receiving surface of the light-receiving device formed by application of the light beam to the light-receiving surface, and wherein at least the light-receiving device, the amplifying circuit, and the fixed resistor are integrated on an identical semiconductor substrate.

10. An optical disc apparatus comprising:

a driving unit that holds and rotates an optical recording medium; and an optical pickup that irradiates the optical recording medium rotated by the driving unit with a light beam for recording and/or playback and that detects a reflective light beam formed by reflection of the light beam by the optical recording medium, wherein the optical pickup includes a light source that emits the light beam, an objective lens that condenses the light beam emitted from the light source and that irradiates the optical recording medium with the light beam, a first light detector that receives via the objective lens the reflected light beam formed by the reflection of the light beam applied from the light source by the optical recording medium, and a second light detector that receives the light beam applied from the light source for monitoring output power of the light source, wherein the second light detector includes a light-receiving device that receives the light beam applied from the light source to generate detection signals, and a power monitor circuit section that generates a power monitor signal for monitoring the output power of the light source in accordance with the detection signals, wherein the light-receiving device includes a plurality of split light-receiving elements, wherein the detection signals are output from the plurality of split light-receiving elements as split detection signals, wherein the power monitor circuit section includes an amplifying circuit that amplifies a signal obtained by adding all the plurality of split detection signals to generate the power monitor signal and that outputs the power monitor signal as a first differential signal and a second differential signal whose polarities are opposite to each other, a fixed resistor that determines a gain of the amplifying circuit, and a position-detecting signal output circuit that generates, in accordance with the plurality of split detection signals, a first position-detecting signal and a second position-detecting signal identifying a position of a light spot on a light-receiving surface of the light-receiving device formed by application of the light beam to the light-receiving surface, and wherein at least the light-receiving device, the amplifying circuit, and the fixed resistor are integrated on an identical semiconductor substrate.

\* \* \* \* \*